(12) United States Patent
Han et al.

(10) Patent No.: US 12,099,133 B2
(45) Date of Patent: Sep. 24, 2024

(54) INDOOR ACCESS POINT POSITION MANAGEMENT

(71) Applicant: Hewlett Packard Enterprise Development LP, Houston, TX (US)

(72) Inventors: Jianpo Han, Beijing (CN); Jiguang Zheng, Beijing (CN); Kuanyue Li, Beijing (CN)

(73) Assignee: Hewlett Packard Enterprise Development LP, Spring, TX (US)

( * ) Notice: Subject to any disclaimer, the term of this patent is extended or adjusted under 35 U.S.C. 154(b) by 435 days.

(21) Appl. No.: 17/487,630

(22) Filed: Sep. 28, 2021

(65) Prior Publication Data

US 2023/0099699 A1    Mar. 30, 2023

(51) Int. Cl.
*G01S 5/02* (2010.01)
*G01R 33/022* (2006.01)
*G01R 33/24* (2006.01)

(52) U.S. Cl.
CPC .......... *G01S 5/0284* (2013.01); *G01R 33/022* (2013.01); *G01R 33/24* (2013.01)

(58) Field of Classification Search
CPC ...... G01S 5/14; G01S 2205/02; G01S 5/0289; G01S 19/396; G01S 5/0027; G01R 33/022; G01R 33/24; G01R 33/0094; G01R 33/10; H04W 4/029; H04W 64/00; H04W 4/02; H04W 4/021; H04W 4/33; H04W 4/80; H04W 16/10; H04W 16/22; H04W 24/10; H04W 4/023; H04W 4/024; H04W 4/185; H04W 64/003; H04W 72/0453; H04W 72/542; H04W 88/08; G01C 21/206; G01C 21/005; G01C 21/08

See application file for complete search history.

(56) References Cited

U.S. PATENT DOCUMENTS 9,220,081 B2   12/2015   Prechner et al.
9,222,785 B2   12/2015   Banin et al.
(Continued)

FOREIGN PATENT DOCUMENTS

CN      204539487 U  *   8/2015
CN      107645702 A  *   1/2018
WO   WO-20200099646       5/2020

*Primary Examiner* — Matthew C Sams
(74) *Attorney, Agent, or Firm* — Hewlett Packard Enterprise Patent Department

(57) ABSTRACT

In embodiments of the present disclosure, a method is provided for managing an AP position for an access point. In the method, a magnetic distribution map is obtained for an indoor area, the magnetic distribution map representing a plurality of reference magnetic values that are collected at a plurality of reference positions in the indoor area. A plurality of magnetic measurements are received, here the plurality of magnetic measurements are respectively collected at a plurality of access point (AP) positions at which a plurality of APs are deployed within the indoor area, and the plurality of AP positions are unknown. The plurality of AP positions are mapped to a portion of the plurality of reference positions based on the plurality of magnetic measurements and the plurality of reference magnetic values. The plurality of AP positions are determined based on the portion of the plurality of reference positions. Therefore, AP positions may be determined accurately and effectively in an indoor environment.

16 Claims, 6 Drawing Sheets

(56) References Cited

U.S. PATENT DOCUMENTS

| | | | |
|---|---|---|---|
| 9,320,010 B2 | 4/2016 | Segev | |
| 9,813,863 B2 | 2/2017 | Jose et al. | |
| 9,706,359 B2 | 3/2017 | Do | |
| 9,763,044 B2 | 9/2017 | Steiner | |
| 10,200,964 B2 | 2/2019 | Amizur | |
| 11,070,948 B2 * | 7/2021 | Shirakata | H04M 11/00 |
| 11,096,008 B1 * | 8/2021 | Batten | G01S 5/02523 |
| 2005/0032526 A1 * | 2/2005 | Chen | G01S 5/12 |
| | | | 455/422.1 |
| 2007/0010257 A1 * | 1/2007 | Capuzzello | H04W 64/00 |
| | | | 455/456.1 |
| 2013/0080048 A1 * | 3/2013 | Kim | G01C 21/20 |
| | | | 701/431 |
| 2013/0303185 A1 * | 11/2013 | Kim | H04W 4/029 |
| | | | 455/456.1 |
| 2015/0173091 A1 * | 6/2015 | Ratasuk | H04W 16/10 |
| | | | 455/452.2 |
| 2018/0091949 A1 | 3/2018 | Steiner et al. | |
| 2019/0049231 A1 * | 2/2019 | Choi | G01B 7/004 |
| 2020/0029236 A1 | 1/2020 | Segev et al. | |
| 2020/0142076 A1 * | 5/2020 | Gulo | G01S 5/0027 |
| 2020/0240789 A1 * | 7/2020 | Huberman | H04W 4/02 |
| 2022/0163330 A1 * | 5/2022 | Kamata | G01C 21/20 |
| 2023/0099699 A1 * | 3/2023 | Han | G01R 33/022 |
| | | | 455/456.1 |

* cited by examiner

INDOOR ACCESS POINT POSITION MANAGEMENT

BACKGROUND

Nowadays, access point (AP) positioning is becoming an essential feature for AP management and various solutions have been proposed for determining a position of an AP. However, these solutions cannot determine an absolute and accurate position for the AP in an indoor environment. Therefore, it is desired to propose a more effective solution for determining a position of an indoor AP in the indoor environment.

SUMMARY

According to a first aspect of the present disclosure, there is provided a method for managing an AP position for an AP. In the method, a magnetic distribution map is obtained for an indoor area, the magnetic distribution map representing a plurality of reference magnetic values that are collected at a plurality of reference positions in the indoor area. A plurality of magnetic measurements are received, here the plurality of magnetic measurements are respectively collected at a plurality of AP positions at which a plurality of APs are deployed within the indoor area, and the plurality of AP positions are unknown. The plurality of AP positions are mapped to a portion of the plurality of reference positions based on the plurality of magnetic measurements and the plurality of reference magnetic values. The plurality of AP positions are determined based on the portion of the plurality of reference positions.

According to a second aspect of the present disclosure, there is provided an electronic device that comprises a processor and a memory coupled to the processor, the memory storing program instructions to cause the processor to implement a method. The method comprising: obtaining a magnetic distribution map for an indoor area, the magnetic distribution map representing a plurality of reference magnetic values that are collected at a plurality of reference positions in the indoor area; receiving a plurality of magnetic measurements that are respectively collected at a plurality of AP positions at which a plurality of APs are deployed within the indoor area, the plurality of AP positions being unknown; mapping the plurality of AP positions to a portion of the plurality of reference positions based on the plurality of magnetic measurements and the plurality of reference magnetic values, and determining the plurality of AP positions based on the portion of the plurality of reference positions.

According to a third aspect of the present disclosure, there is provided a computer program product, the computer program product comprising a computer readable storage medium having program instructions embodied therewith, and the program instructions executable by an electronic device to cause the electronic device to perform a method. The method comprises: obtaining a magnetic distribution map for an indoor area, the magnetic distribution map representing a plurality of reference magnetic values that are collected at a plurality of reference positions in the indoor area; receiving a plurality of magnetic measurements that are respectively collected at a plurality of AP positions at which a plurality of APs are deployed within the indoor area, the plurality of AP positions being unknown; mapping the plurality of AP positions to a portion of the plurality of reference positions based on the plurality of magnetic measurements and the plurality of reference magnetic values; and determining the plurality of AP positions based on the portion of the plurality of reference positions.

With the above aspects of the present disclosure, based on the magnetic measurements collected at the APs and the reference magnetic values in the magnetic distribution map, unknown AP positions may be mapped to reference positions that have known values (for example, represented by the longitude and latitude format), respectively. Therefore, the AP positions may be determined in an easy and effective way.

BRIEF DESCRIPTION OF THE DRAWINGS

Embodiments of the present disclosure may be understood from the following Detailed Description when read with the accompanying Figures. In accordance with the standard practice in the industry, various features are not drawn to scale. In fact, the dimensions of the various features may be arbitrarily increased or reduced for clarity of discussion. Some examples of the present disclosure are described with respect to the following figures.

DETAILED DESCRIPTION

Figure 1:
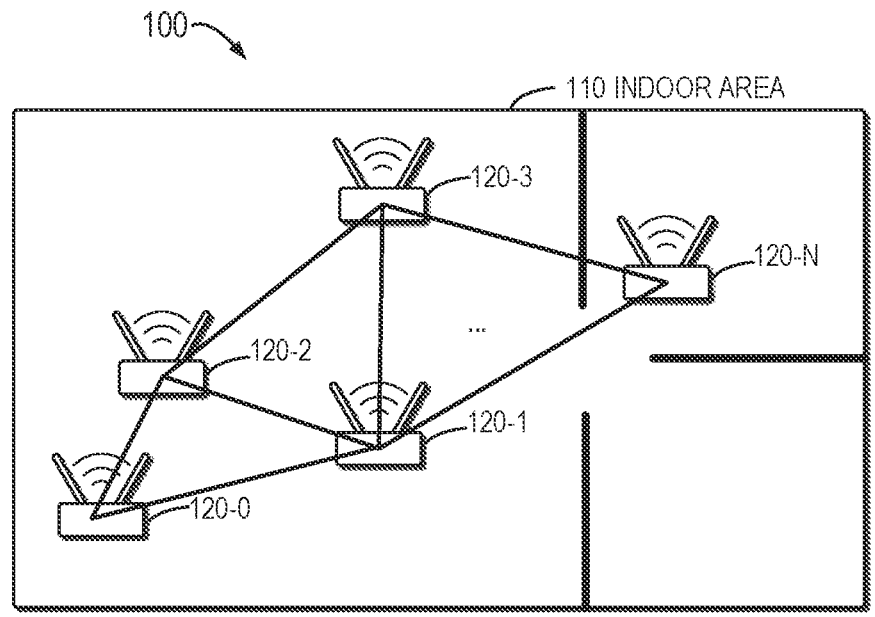
FIG. 1 illustrates a block diagram of an indoor environment in which embodiments of the present disclosure may be implemented.

Nowadays, a great number of APs are deployed inside buildings for providing terminal devices with Internet services and/or other types of network services. The AP positions are essential features for AP management, for example, special services may be provided to these terminal devices based on the AP positions. Reference will be made to FIG. 1 for a general description of the indoor environment. FIG. 1 illustrates a block diagram 100 of an indoor area 110 in which embodiments of the present disclosure may be implemented. In FIG. 1, the indoor area 110 represents an area that is inside a building. Multiple APs may be deployed in the indoor area 110, for example, APs 120-0, 120-1, 120-2, 120-3, . . . , and 120-N may be included in the indoor area 110. Although FIG. 1 illustrates the indoor area 110 in a two-dimensional format with only one floor in the building, the indoor area 110 may include more floors and thus the indoor area 110 may be represented in a three-dimensional format.

Various solutions are provided in the positioning field, for example, GPS (Global Positioning System) solutions are popular for outdoor positioning. However, GPS signals may become weak in the indoor environment, and concrete walls, metal windows and the like in the building may greatly reduce strengths of the GPS signals. Further. FTM (Fine Time Measurement) solutions use Wi-Fi signals for determining AP positions in the indoor environment. However, the FTM solution can only obtain relative positions among various APs but cannot provide an absolute position for each AP. A distance may be determined for each pair of APs, while the absolute position for each AP is still unknown. Although an AP may be identified as an anchor AP from the multiple APs, and an absolute position of the anchor AP may be determined based on the GPS solution and/or another solution. The accuracy for FTM solutions is not satisfied by now.

In view of the above drawbacks, embodiments of the present disclosure provide a more effective way for indoor positioning. In embodiments of the present disclosure, multiple APs are deployed at multiple unknown AP positions in the indoor area 110, where a magnetic sensor may be deployed at each AP for collecting the magnetic measurement at each AP. Magnetic measurements collected at the multiple APs are compared with a magnetic distribution map of the indoor area 110 for mapping the multiple unknown AP positions to multiple predefined reference positions in the indoor area 110, such that the unknown AP positions may be determined. Therefore, the AP positions may be determined in an easy and effective way.

Figure 2:
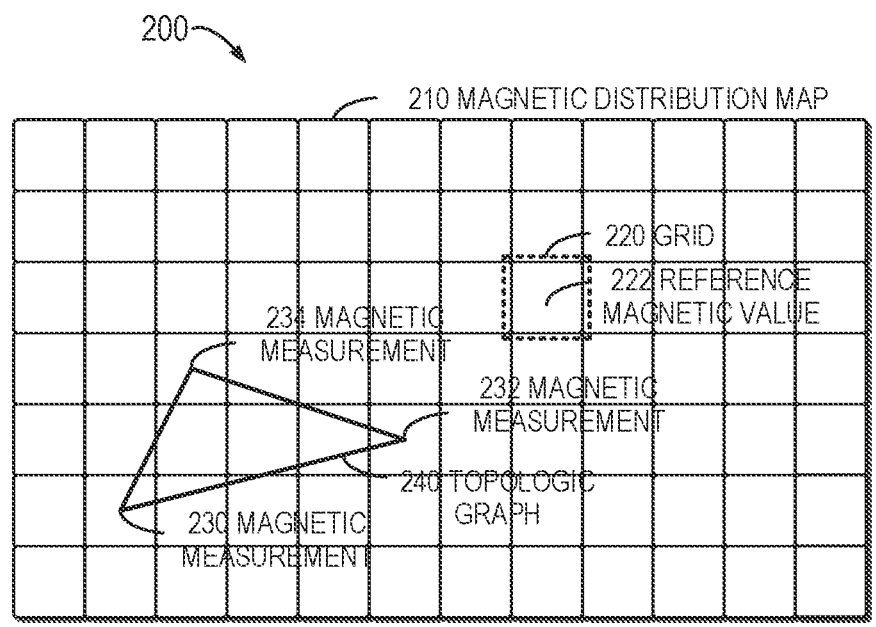
FIG. 2 illustrates a block diagram of an example procedure for determining AP positions according to embodiments of the present disclosure.

Reference will be made to FIG. 2 for a general description of the present disclosure, here FIG. 2 illustrates a block diagram 200 of an example procedure for determining AP positions according to embodiments of the present disclosure. In FIG. 2, a magnetic distribution map 210 is obtained for the indoor area 110. As known, the geomagnetic field is widely distributed in indoor spaces and may vary due to environmental factors. Therefore, the magnetic strengths at various indoor positions may be used for facilitating the indoor positioning. Here, the magnetic distribution map 210 may represent a plurality of reference magnetic values that are collected at a plurality of known reference positions in the indoor area.

In embodiments of the present disclosure, the indoor area 110 may be divided into multiples grids with a side length of 0.5 m (or another value) for defining multiple reference positions, and a reference magnetic value may be collected with a magnetic sensor at each grid for generating the magnetic distribution map 210 in advance. For example, with respect to a grid 220, a reference magnetic value 222 may be collected by placing the magnetic sensor at a center of the grid 220. Here, the magnetic distribution map 210 may be generated by collecting reference magnetic values at all the grids within the indoor area 110. Alternatively and/or in addition to, the magnetic distribution map 210 may be obtained from a third party. At this point, the magnetic distribution map 210 may be used as a base for the indoor positioning. In some embodiments of the present disclosure, the magnetic distribution map 210 may be represented in a format as shown in Table 1.

TABLE 1

| Example Magnetic Distribution Map | | | |
|---|---|---|---|
| mmap($x_0, y_0$) | mmap($x_1, y_0$) | . . . | mmap($x_m, y_0$) |
| mmap($x_0, y_1$) | mmap($x_1, y_1$) | . . . | mmap($x_m, y_1$) |
| . . . | . . . | . . . | . . . |
| mmap($x_0, y_n$) | mmap($x_1, y_n$) | . . . | mmap($x_m, y_n$) |

In Table 1, m and n are positive integers and represent that the indoor area 110 is divided into m*n grids, and mmap ($x_i, y_j$) (i and j are positive integers) represents the reference magnetic value that is collected at the reference position ($x_i, y_j$) (for example, represented in the longitude and latitude format) at the grid (i,j) in the indoor area 110. In embodiments of the present disclosure, the reference position may also be represented by a relative position format. For example, the upper left grid in the magnetic distribution map 210 may be defined as an original point for the magnetic distribution map 210, and thus another grid may be presented by an offset (i,j) between the other grid and the original point. It is to be understood that the above Table 1 is just example for the magnetic distribution map 210, and another format may be used in another embodiment of the present disclosure. For example, when the indoor area 110 include multiple floors in the building, each element in Table 1 may be presented in a three-dimensional format such as mmap($x_i, y_j, z$) (z is a positive integer for indicating the floor number).

Further, a plurality of magnetic measurements may be collected at a plurality of AP positions at which a plurality of APs are deployed within the indoor area 110, respectively, and the plurality of AP positions are unknown at the beginning. To simplify the description, three APs 120-1, 120-2 and 120-3 are selected for representing the plurality of APs, and the proposed solution may also be used for determining AP positions for more than three APs. In FIG. 2, three magnetic measurements 230, 232, and 234 may be collected at AP positions for the above three APs, respectively. Therefore, the three AP positions may be mapped to three reference positions via a topologic graph 240 in the magnetic distribution map 210 based on the magnetic measurements 230, 232, and 234 and the plurality of reference magnetic values, so as to determine the three AP positions.

With these embodiments, the AP positions may be determined in an easy and effective way by comparing the multiple magnetic measurements and reference magnetic values that are recorded in the magnetic distribution map 210. As accurate reference positons (for example, represented in the longitude and latitude format) in the indoor area 110 are known in advance, a portion of reference positions matching the multiple magnetic measurements 230, 232 and 234 may be identified as the AP positions. Compared with the conventional FTM solution that only knows the accurate positon for the anchor AP, embodiments of the present disclosure may greatly increase the accuracy for the indoor positioning.

Figure 3:
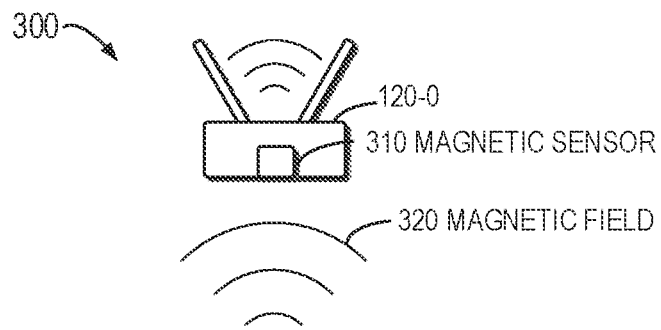
FIG. 3 illustrates a block diagram of an example procedure for collecting a magnetic measurement at an AP according to embodiments of the present disclosure.

Hereinafter, reference will be made to FIGS. 3-10 for more details of the embodiments of the present disclosure. FIG. 3 illustrates a block diagram 300 of an example procedure for collecting a magnetic measurement at an AP according to embodiments of the present disclosure. Here, a magnetic sensor may be deployed at each of the indoor APs, for example, a magnetic sensor 310 is deployed at the AP 120-0 for collecting a magnetic measurement of the magnetic field 320. Therefore, three magnetic measurements 230, 232, and 234 may be collected for the APs 120-0, 120-1 and 120-2, respectively.

Further, the magnetic measurements 230, 232, and 234 may be mapped to a portion of the plurality of reference positions as shown in the above Table 1. In some embodiments of the present disclosure, a topologic graph may be generated for the plurality of APs based on relative distances among the plurality of AP positions. Here, the relative distances may be determined based on the FTM solution. For example, Wireless Fidelity (Wi-Fi) signals may be transmitted among the APs so as to determine the relative distances among these APs based on time difference between the transmitting and receiving time points. In other embodiments of the present disclosure, the relative distances may be obtained by another way, for example, a laser device may be used for measuring the relative distances.

Figure 4A:
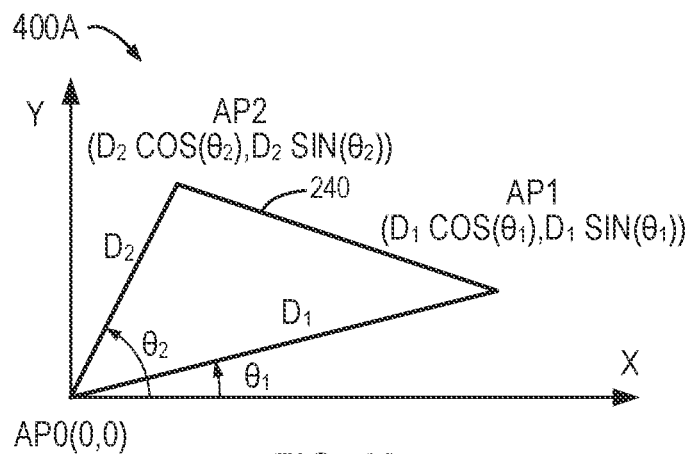
FIG. 4A illustrates a block diagram of example AP positions of a topologic graph associated with the APs according to embodiments of the present disclosure.

Once the relative distances are obtained, the topologic graph may be generated according to the relative distances. For example, with respect to the three APs 120-0, 120-1 and 120-2, a topologic graph including a triangle may be generated and each vertex in the triangle corresponds to one of the above APs. A coordinate may be generated for the topologic graph and reference may be made to FIG. 4A for more details. FIG. 4A illustrates a block diagram 400A of example AP positions of a topologic graph associated with the APs according to embodiments of the present disclosure. In FIG. 4A, a coordinate may be generated for the topologic graph 240 by taking an AP position (represented by AP0(0, 0)) for the AP 120-0 as an original point of coordinate. Here, an angle between the x-axis and an edge $d_1$ between AP0 and AP1 is donated as $\theta_1$, and an angle between the x-axis and an edge $d_2$ between AP0 and AP2 is donated as $\theta_2$. At this point, positions of the other two APs 120-1 and 120-2 may be determined from Formulas (1) and (2) as AP1($d_1 \cos(\theta_1)$, $d_1 \sin(\theta_1)$) and AP2($d_2 \cos(\theta_2)$, $d_2 \sin(\theta_2)$):

$$x_i = d_i * \cos(\theta_i) \quad \text{Formula (1)}$$

$$y_i = d_i * \sin(\theta_i) \quad \text{Formula (2)}$$

With embodiments of the present disclosure, the unknown AP positions (AP0, AP1, and AP2) of the APs may be represented by Formulas (1) and (2), and then the topologic graph 240 may be placed in the magnetic distribution map 210 for the mapping. Therefore, the unknown AP positions may be calculated by solving a mathematical problem.

Figure 4B:
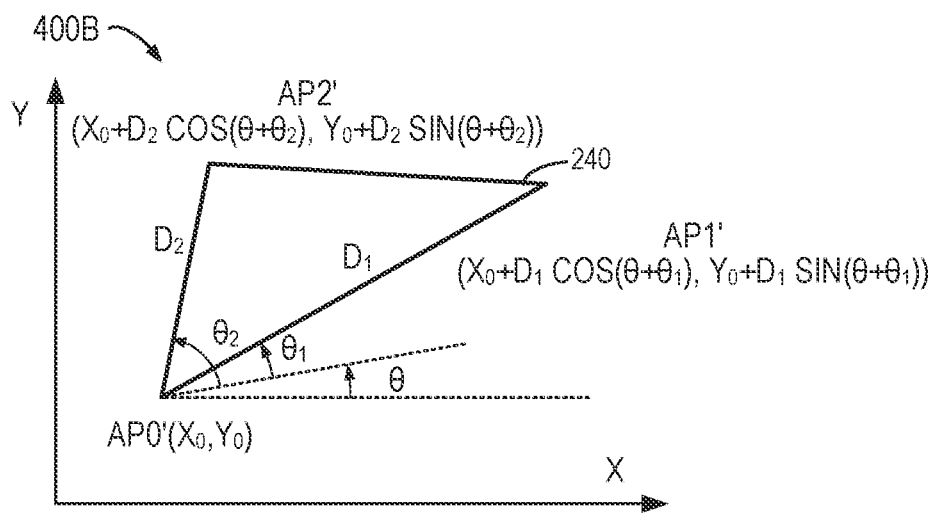
FIG. 4B illustrates a block diagram of example AP positions after a movement of a topologic graph associated with the APs according to embodiments of the present disclosure.

In embodiments of the present application, the topologic graph 240 may be placed at any position in the magnetic distribution map 210, and then the topologic graph 240 may be moved in the magnetic distribution map 210 for finding an appropriate position that makes the magnetic measurements 230, 232 and 234 match some of the reference magnetic values in the magnetic distribution map 210. Reference will be made to FIG. 4B for more details about a movement of the topologic graph 240, here FIG. 4B illustrates a block diagram 400B of example AP positions after a movement of a topologic graph associated with the APs according to embodiments of the present disclosure. In FIG. 4B, the topologic graph 240 may be subjected to any of a shifting operation or a rotating operation. Alternatively, the topologic graph 240 may be subjected to both of the shifting and rotating operations. For example, the AP0 may move to AP0'($x_0, y_0$) by the shifting operation, and the edge $d_1$ may rotate an angle $\theta$ counterclockwise by the rotating operation, and the AP positions after the movement may be determined based on the following formulas (3) and (4). At this point, AP1 and AP2 change to AP1'($x_0 + d_1 \cos(\theta + \theta_1)$, $y_0 + d_1 \sin(\theta + \theta_1)$) and AP2'($x_0 + d_2 \cos(\theta + \theta_2)$, $y_0 + d_2 \sin(\theta + \theta_2)$), respectively.

$$x_i = x_0 + d_i * \cos(\theta + \theta_i) \quad \text{Formula (3)}$$

$$y_i = y_0 + d_i * \sin(\theta + \theta_i) \quad \text{Formula (4)}$$

In embodiments of the present disclosure, in order to find the appropriate position for placing the topologic graph 240 into the magnetic distribution map 210, a cost function may be generated based on a difference between magnetic measurements related to vertexes of the topologic graph and a group of reference magnetic values in the plurality of magnetic values that are related to the vertexes. Specifically, with respect to each vertex in the topologic graph 240, the difference may be determined as $\text{Sqrt}(\text{mmap}(x_i, y_i) - \text{APM}_k)$, where $\text{mmap}(x_i, y_i)$ represents a reference magnetic value defined in the above Table 1, $\text{APM}_k$ represents a magnetic measurement that is collected at the $k^{th}$ AP in the plurality of APs, and Sert( ) represents a square root function. Therefore, the cost function may be generated based on the following Formula (5).

$$f(x, y, \theta) = \text{Sert}(\Sigma_0^N (\text{mmap}(x_i, y_i) - \text{APM}_k)^2) \quad \text{Formula (5)}$$

In Formula (5), N represents the number of the plurality of APs, and N=3 in the examples of FIG. 2. It is to be understood that the above Formula (5) is just an example for the cost function, alternative and/or in addition to, the cost function may be represented by another formula. For example, an absolute value of the difference between mmap($x_i, y_i$) and $\text{APM}_k$ may be used for defining the cost function. In another example, the variance or the standard deviation may be used for defining the cost function.

In embodiments of the present disclosure, the cost function is based on a value of $(x, y, \theta)$, and thus the target is to find a vector $(x, y, \theta)$ for the topologic graph 240 that may minimize the cost function $f(x, y, \theta)$. Therefore, minimizing the cost function relates to a regression procedure which includes only 3 variables $(x, y, \theta)$ and then a typical regression procedure shown as below may be implemented for determining the appropriate vector $(x, y, \theta)$ for placing the topologic graph 240 into the magnetic distribution map 210. In embodiments of the present disclosure, values for $(x, y)$ may be initialized randomly as a valid position in the magnetic distribution map 240, and $\theta$ may be initialized as 0 or another value. Then, the gradient descend regression may be implemented for updating the vector $(x, y, \theta)$, until the cost function $f(x, y, \theta)$ meets a threshold criterion (for example, $f(x, y, \theta) < 3$) based on the following Formulas (6) to (11).

$$x = x - \lambda \frac{df(x, y, \theta)}{dx} \quad \text{Formula (6)}$$

$$y = y - \lambda \frac{df(x, y, \theta)}{dy} \quad \text{Formula (7)}$$

$$\theta = \theta - \lambda \frac{df(x, y, \theta)}{d\theta} \quad \text{Formula (8)}$$

$$\frac{df(x, y, \theta)}{dx} = \quad \text{Formula (9)}$$

$$\frac{1}{f(x, y, \theta)} \times \sum_{k=0}^{n} (\text{mmap}(x_i, y_i) - \text{APM}_i) \times \frac{\partial (\text{mmap}(x_i, y_i))}{\partial xi}$$

-continued $$\frac{df(x, y, \theta)}{dy} = $$ Formula (10)

$$\frac{1}{f(x, y, \theta)} \times \sum\nolimits_{i=0}^{n} (mmap(x_i, y_i) - APM_i) \times \frac{\partial(mmap(x_i, y_i))}{\partial y_i}$$

Formula (11)

$$\frac{df(x, y, \theta)}{d\theta} = $$

$$\frac{\sum\nolimits_{i=0}^{n} (mmap(x_i, y_i) - APM_i) *}{\left(-\frac{\partial(mmap(x_i, y_i))}{\partial x_i} d_i \sin(\theta + \theta i) + \frac{\partial(mmap(x_i, y_i))}{\partial y_i} d_i \cos(\theta + \theta_i)\right)}{f(x, y, \theta)}$$

In the above Formulas (6)-(11), variables have the same meanings as those in the Formulas (1)-(5). Further, symbols such as $$\frac{df0}{dx}, \frac{df0}{dy}, \frac{\partial 0}{\partial xi}, \text{ and } \frac{\partial 0}{\partial xi}$$

represent corresponding derivation operations and details are omitted hereinafter.

In embodiments of the present disclosure, the topologic graph 240 may be moved within the magnetic distribution map 210 until a vector (x,y,θ) that meets the threshold criterion is found. In one example, the criterion may define that the cost function ƒ(x,y,θ) should be below a predefined value ∋ (for example, 0.1 or another value). In another example, the criterion may define that the above gradient descend regression may be run for a predefined time length (for example, 30 minutes or another value) and a vector (x,y,θ) that leads to a minimized value for the cost function may be selected for placing the topologic graph 240 into the magnetic distribution map 210. In a further example, a further criterion may be defined based on other requirements of the indoor positioning.

Figure 5A:
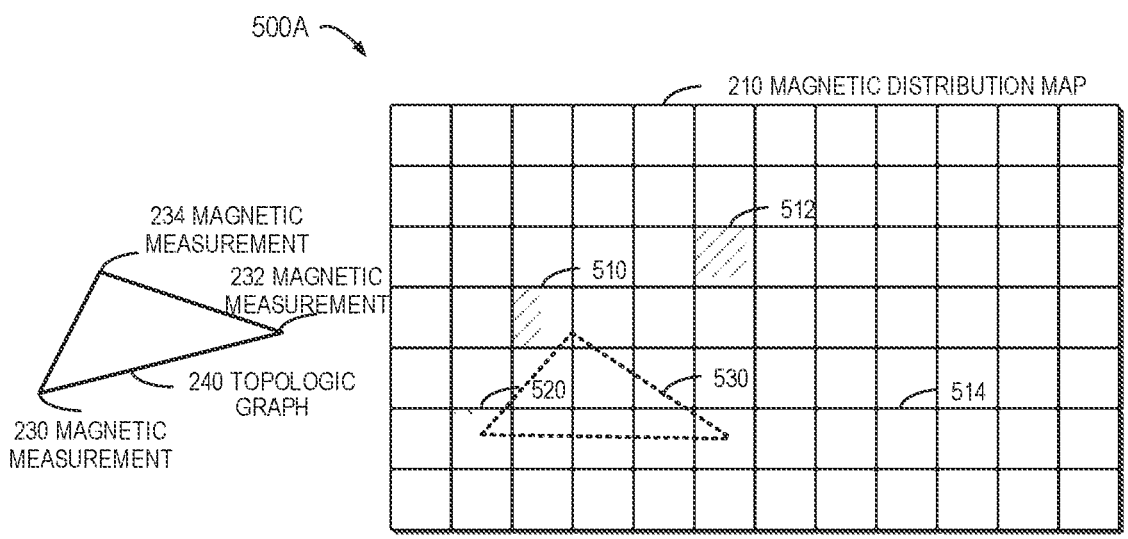
FIG. 5A illustrates a block diagram of an example procedure for determining an initial position for a vertex in a topologic graph according to embodiments of the present disclosure.

Although the above regression procedure may output a vector (x,y,θ), sometimes the regression procedure may last for a long time. Due to the performance of the regression depends on the initial position and rotation of the topologic graph 240, the initial position and rotation may be calculated based on a comparison of the reference magnetic values in the magnetic distribution map 210 and the plurality of magnetic measures collected at the plurality of APs. It is known that reference magnetic values and reference positions in the magnetic distribution map 210 are not always in the one-to-one correspondence, and sometimes multiple reference positions may have the same reference magnetic value, therefore a reference position having a unique reference magnetic value may carry more position information. Reference will be made to FIG. 5A for more details about determining the initial position and rotation for the topologic graph 240.

FIG. 5A illustrates a block diagram 500 of an example procedure for determining an initial position for a vertex in a topologic graph according to embodiments of the present disclosure. In FIG. 5A, multiple reference positions 510, 512 and 514 in the magnetic distribution map 210 have the same reference magnetic value, and a reference position 520 has a unique reference magnetic value. At this point, compared with the reference positions 510, 512 and 514, the reference position 520 may be a better choice for the initial position for the topologic graph 240. Further, the magnetic measurements 230, 232 and 234 associated with the three vertexes of the topologic graph 240 may be compared with the unique reference magnetic value at the position 520. Then, a vertex that has a closest magnetic value to the unique reference magnetic value may be selected from the three vertexes in the topologic graph 240. Next, the topologic graph 240 may be placed by moving the selected vertex to the reference position 520.

Supposing the lower left vertex in the topologic graph 240 has the closest magnetic value, then the lower left vertex may be placed at the reference position 520 and then the topologic graph 240 is placed in a posture 530 in the magnetic distribution map 210. Further, the initial rotation of the topologic graph 240 may be determined based on various ways. For example, the initial rotation may be set to 0, alternatively and/or in addition to, the initial rotation may be set to an angle that is randomly selected from 0 to 360.

It is to be understood that the above paragraphs only provide an example procedure for selecting the initial position when there is a unique reference magnetic value in the magnetic distribution map 210. Sometimes there may not exist a unique reference magnetic value, at this point, occurrence frequencies for the various reference magnetic values may be sorted in an ascending order, and reference positions related to a reference magnetic value that occurs with the lowest frequency may be selected. With the above embodiments, the topologic graph 240 may be placed at an initial position that carries more position information in the magnetic distribution map 210. Therefore, the above regression procedure may be started at a better position and thus the time duration for the regression procedure may be reduced.

Figure 5B:
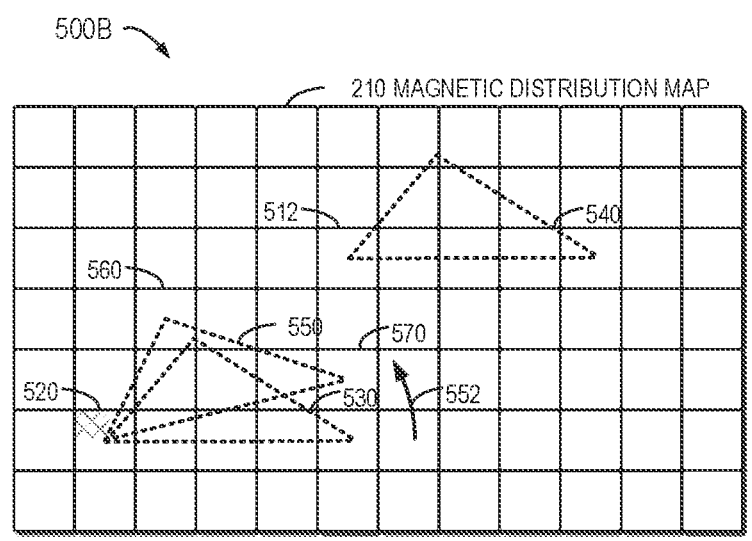
FIG. 5B illustrates a block diagram of an example procedure for moving a topologic graph within a magnetic distribution map according to embodiments of the present disclosure.

Referring to FIG. 5B for details about moving the topologic graph 240 to a different posture in the magnetic distribution map 210 during the regression procedure. FIG. 5B illustrates a block diagram 500B of an example procedure for moving a topologic graph within a magnetic distribution map according to embodiments of the present disclosure. Here, moving the topologic graph includes at least one of: shifting the topologic graph or rotating the topologic graph within the magnetic distribution map 210.

In the shifting step, the topologic graph 240 may be shifted to a next grid along the x-axis or y-axis at each step. For example, after several shifting steps, the lower left vertex of the topologic graph 240 may be shifted from the reference position 520 to the reference position 512. At this point, the topologic graph is in a posture 540. In the rotating step, the topologic graph 240 may be rotated by a predefined angle (for example, 1 degree or another value) around the lower left vertex along an arrow 552. For example, after several rotating steps, the topologic graph is in a posture 550. It is to be understood that FIG. 5B only shows the situations for implementing the shifting step and rotating step independently, the shifting step and rotating step may be implemented together, and details are omitted hereinafter.

In embodiments of the present disclosure, the topologic graph 240 may be moved to various postures during the regression procedure, and the above Formulas (6)-(11) may be used to determine a value of the cost function ƒ(x,y,θ) corresponding to each posture. Therefore, a vector (x,y,θ) that causes the cost function to meet the predefined criterion may be selected as the position for placing the topologic graph 240.

Still referring to FIG. 5B, supposing the posture 550 makes the cost function to meet the predefined criterion, then the reference positions in which the three vertexes locate may be selected for the indoor positioning. As shown in FIG. 5B, the vertex for the AP 120-0 locates in the reference position 520, the vertex for the AP 120-1 locates in the reference position 570, and the vertex for the AP 120-2 locates in the reference position 560, therefore the AP positions for the APs 120-0, 120-1 and 120-2 may be determined as the reference positions 520, 570 and 560. Specifically, the absolute reference positions 520, 570 and 560 may be found in the magnetic distribution map 210. With these embodiments, as the reference positions are absolute positions and have accurate known values, AP positions that are mapped to the reference positions may be determined in an easy and effective way, and the accuracy for the AP positions may also be increased.

Figure 6:
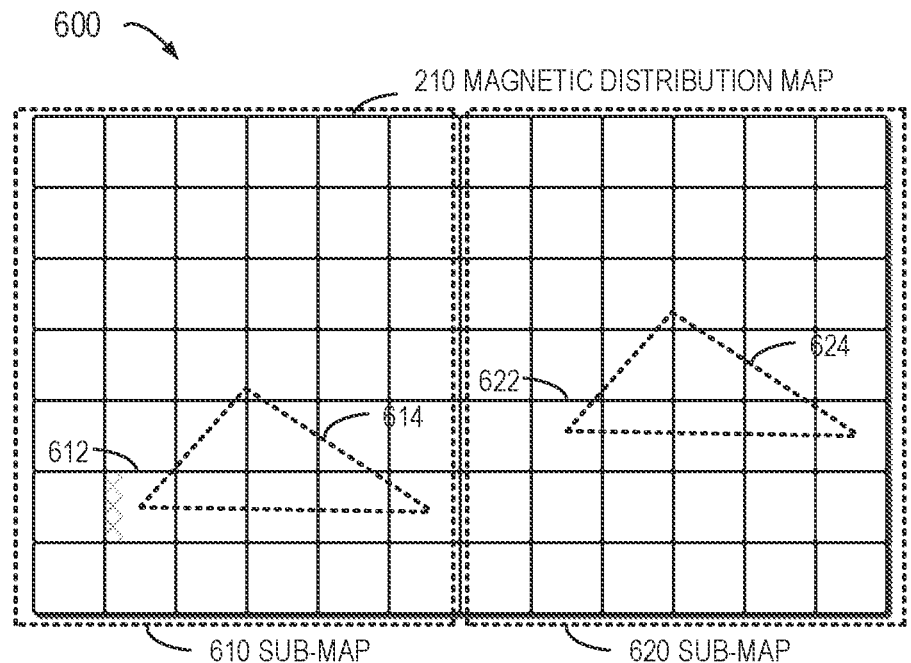
FIG. 6 illustrates a block diagram of an example procedure for running a regression procedure in each of multiple sub-maps according to embodiments of the present disclosure.

Sometimes, the determined vector $(x,y,\theta)$ is a local optimal value but not a global optimal one. At this point, the indoor area 110 may be divided into multiple sub-areas, and the above regression procedure may be implemented in each of these sub-areas. Referring to FIG. 6, FIG. 6 illustrates a block diagram 600 of an example procedure for running a regression procedure in each of multiple sub-maps according to embodiments of the present disclosure. Here, the indoor area 110 may be divided into two sub-areas and thus the magnetic distribution map 210 may also be divided into two corresponding sub-maps 610 and 620. The above procedure for selecting the initial position and rotation may be run in each sub-map. For example, the lower left vertex of the topologic graph 240 may be placed at a position 612 in the sub-map 610 with a posture 614. Similarly, the lower left vertex of the topologic graph 240 may be placed at a position 622 in the sub-map 620 with a posture 624.

Further, the above regression procedure may be implemented in each of the sub-maps 610 and 620, and thus two local optimal vectors $(x_1,y_1,\theta_1)$ and $(x_2,y_2,\theta_2)$ may be determined in the two sub-maps 610 and 620, respectively. Next, the two local optimal vectors may be compared to select a global optimal one that leads to a minimized cost function in the whole indoor area 110. Although the above paragraphs describe the procedure for dividing the indoor area 110 into two sub-areas, in other embodiments of the present disclosure, the indoor area 110 may be divided into more than two sub-areas, and the above regression procedure may be implemented in the multiple sub-areas for obtaining multiple local optimal vectors. Further, the multiple local optimal vectors may be compared to find a global optimal vector $(x,y,\theta)$.

With these embodiments, a local optimal vector may be determined from each of the sub-areas, and thus the problem of local minimization may be alleviated. Therefore, a global optimal vector $(x,y,\theta)$ may be found throughout the magnetic distribution map, which may increase the accuracy for the indoor positioning.

In embodiments of the present disclosure, in order to reduce the computing cost, only a portion of APs may be selected from all the indoor APs that are deployed in the indoor area 110. In the indoor area 110, walls, metal materials, and the like may affect propagations of the Wi-Fi signals. Therefore, sometimes the FTM solution may cause errors in determining the relative distance between some APs. Especially, if a wall exists between two APs, then the relative distance between the two APs may possibly be inaccurate. Therefore, a building map may be obtained for the indoor area 110 for selecting the APs for generating the topologic graph 240, such that accurate relative distances may be determined for the selected APs by the FTM solution.

Figure 7:
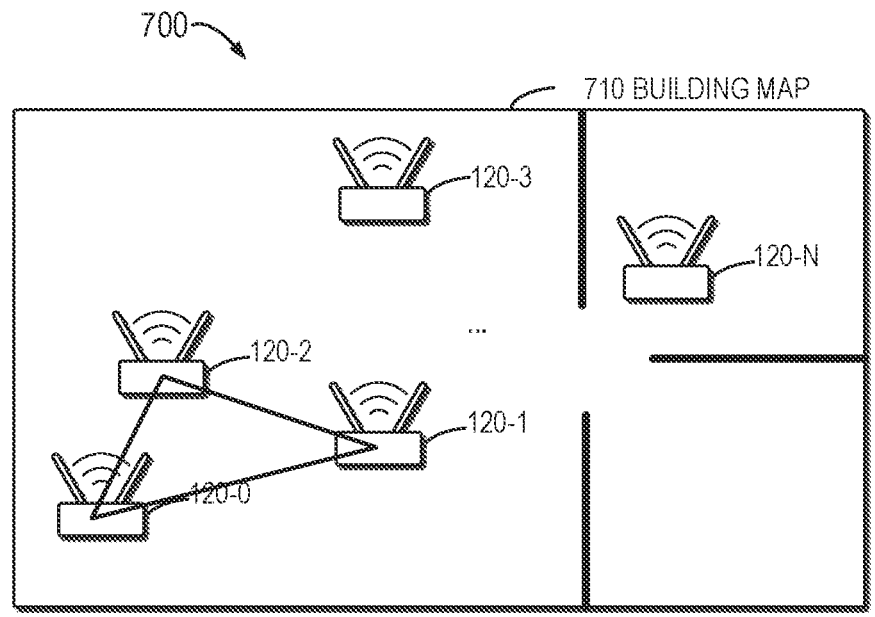
FIG. 7 illustrates a block diagram of an example procedure for selecting a plurality of APs based on a building map according to embodiments of the present disclosure.

In embodiments of the present disclosure, if two APs are in Line of Sight (LOS) based on the building map, then the two APs may be selected from the indoor APs. Referring to FIG. 7, FIG. 7 illustrates a block diagram 700 of an example procedure for selecting a plurality of APs based on a building map according to embodiments of the present disclosure. Here, a building map 710 shows the indoor structure of the building, which indicates that the APs 120-0, 120-1, 120-2, and 102-3 are in an open area without any barrier, and the AP 120-N is deployed in an individual room and is separated from other APs by walls. Therefore, the plurality of APs for generating the topologic graph 240 may be selected from the APs 120-0, 120-1, 120-2, and 120-3 that are in LOS.

Although the above paragraphs describe embodiments where the APs 120-0, 120-1 and 120-2 are selected for generating the topologic graph, more or less APs may be selected. In embodiments of the present disclosure, a pair of APs may be selected from the APs in LOS, and at this point the topologic graph may include a line segment. Although the line segment may be mapped in the magnetic distribution map 210 and AP positions of the pair of APs may be determined from the matched reference positions in the magnetic distribution map 210, the determined AP positions may be not accurate enough due to a fact that another pair of APs may possible have similar magnetic values and relative distance. Therefore, usually the number of the selected APs is equal to or greater than three. Due to three APs usually forms a stable triangle in the topologic graph, the AP positions may be determined in a more reliable way when three or more APs are selected for generating the topologic graph.

In embodiments of the present disclosure, more than three APs may be selected for generating the topologic graph. For example, four APs 120-0, 120-1, 120-2, and 120-3 may be used for building a topologic graph including four vertexes. At this point, a corresponding cost function may be built based on Formula (5) with information related to the four APs. Although the regression procedure may possibly cost more time and computing resources, the determined position may be more accurate.

Figure 8:
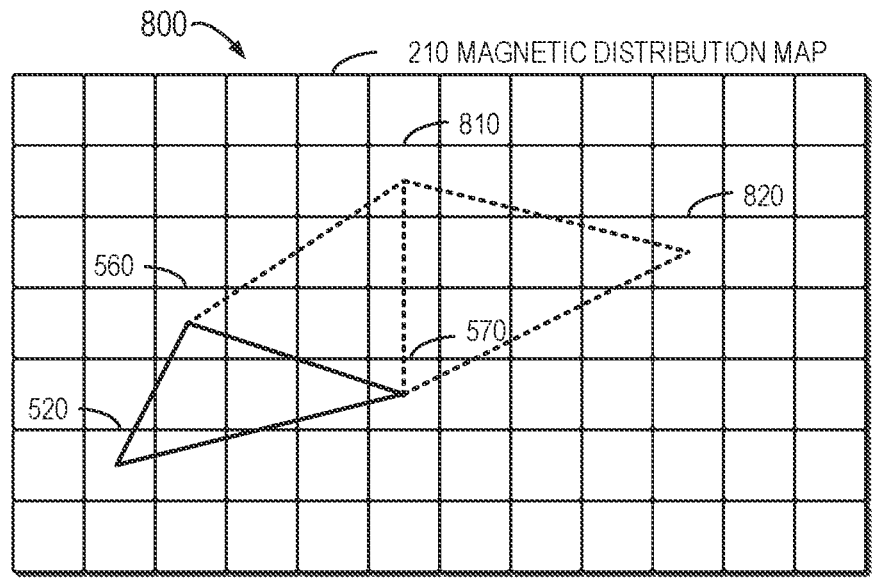
FIG. 8 illustrates a block diagram of an example procedure determining a further position of a further AP according to embodiments of the present disclosure.

The above paragraphs have provided details for determining the AP positions of the selected plurality of APs. Further, it is possible to determine an AP position for an AP that is not selected in building the topologic graph, and reference will be made to FIG. 8 for more details. FIG. 8 illustrates a block diagram 800 of an example procedure determining a further position of a further AP according to embodiments of the present disclosure. Continuing the above example, AP positions for the APs 120-0, 120-1 and 120-2 have been determined as the reference positions 520, 570 and 560, and then AP positions for the other two APs 120-3 and 120-N may also be determined from the magnetic distribution map 210.

Specifically, relative positions between a further AP in the indoor APs and the plurality of APs may be determined. For example, in order to determine the AP position for AP 120-3, the relative positions between the AP 120-3 and the APs 120-1 and 120-2 may be determined. Due to the three APs 120-3, 120-1 and 120-2 form a triangle, the AP position for the AP 120-3 may be mapped to a reference position 810 in the magnetic distribution map 210. Similarly, the AP position for the AP 120-N may be mapped to a reference position 820 in the magnetic distribution map 210. Therefore, the two APs 120-3 and 120-N that are not selected for generating the topologic graph 240 may be determined as the reference positions 810 and 820, respectively. With these embodiments, AP positions for all the indoor APs may be determined in an accurate and effective way.

In embodiments of the present disclosure, AP positions may be determined for all the indoor APs based on both of the magnetic field and the FTM solution. Sometimes when a certain AP is surrounded by walls and/or other barriers, the FTM solution cannot determine accurate relative positions for the certain AP and other APs nearby. Supposing the relative positions between the AP 120-N and other APs nearby cannot be determined by the FTM solution due to the walls around the AP 120-N, the magnetic measurement that is collected at the AP 120-N may be compared with the reference magnetic values in the magnetic distribution map 210 for estimating a reference position(s) that corresponds to the AP 120-N. Although the estimated AP position(s) may not be accurate enough, it may be considered as the estimation for the AP position and may be corrected by another indoor positioning solution.

In embodiments of the present disclosure, the building map may also be used for identifying abnormal relative distances that are measured by the FTM solution. For example, if a measured relative distance is greater than a length of the indoor area that is indicated in the building map, then the relative distance may be labeled as an abnormal one for further processing. With these embodiments, the relative distances may be processed in advance and only normal relative distances may be subjected to the next step for generating the topologic graph. Therefore, the generated topologic graph may represent a geographic distribution of the indoor APs within the indoor area 110 in an accurate way.

Figure 9:
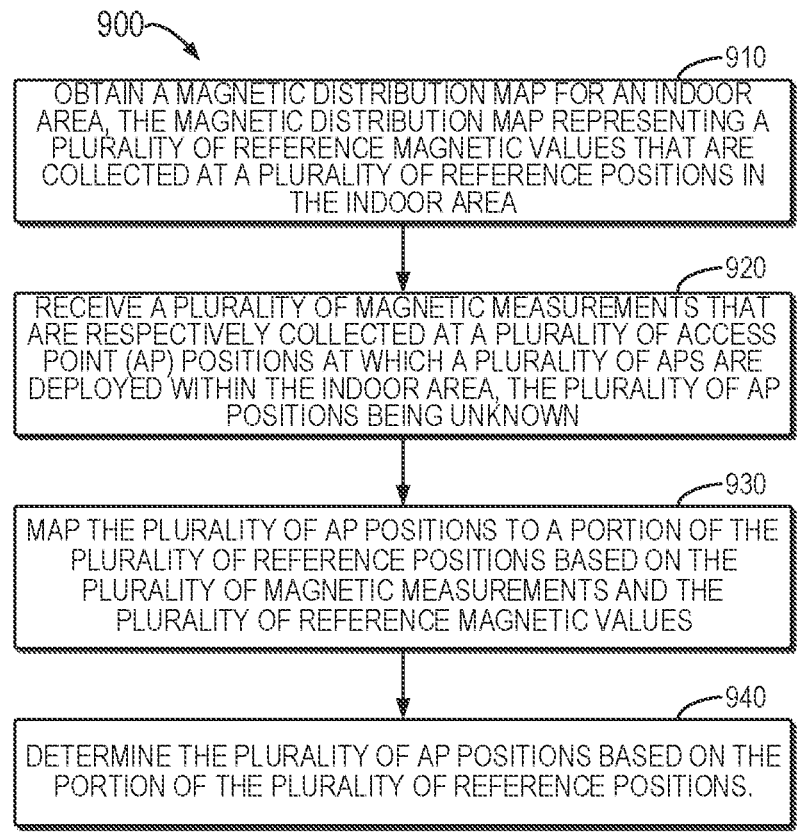
FIG. 9 illustrates a flowchart of an example method for determining AP positions according to embodiments of the present disclosure.

FIG. 9 illustrates a flowchart of an example method 900 for determining AP positions according to embodiments of the present disclosure. At block 910, a magnetic distribution map is obtained for an indoor area, and the magnetic distribution map represents a plurality of reference magnetic values that are collected at a plurality of reference positions in the indoor area. At block 920, a plurality of magnetic measurements are received. Here the plurality of magnetic measurements are respectively collected at a plurality of access point (AP) positions at which a plurality of APs are deployed within the indoor area, and the plurality of AP positions are unknown. At block 930, the plurality of AP positions are mapped to a portion of the plurality of reference positions based on the plurality of magnetic measurements and the plurality of reference magnetic values. At block 940, the plurality of AP positions are determined based on the portion of the plurality of reference positions.

In embodiments of the present disclosure, in order to map the plurality of AP positions to the portion of the plurality of reference positions, a topologic graph is generated for the plurality of APs based on relative distances among the plurality of AP positions. Further, the plurality of AP positions are matched to the portion of plurality of reference positions based on the topologic graph, the magnetic distribution map and the plurality of magnetic measurements. In embodiments of the present disclosure, the topologic graph is placed in the magnetic distribution map. Then, a cost function is built based on a difference between magnetic measurements related to vertexes of the topologic graph and a group of reference magnetic values in the plurality of magnetic values that are related to the vertexes. Further, the portion of the plurality of reference positions are determined in response to the cost function meeting a threshold criterion.

In embodiments of the present disclosure, in order to place the topologic graph in the magnetic distribution map, an initial position and an initial rotation are selected for the topologic graph based on a comparison between the plurality of magnetic measurements and the plurality of reference magnetic values. Further, the topologic graph is placed in the magnetic distribution map based on the initial position and the initial rotation. In embodiments of the present disclosure, the topologic graph is moved in the magnetic distribution map by any of: shifting the topologic graph in the magnetic distribution map; or rotating the topologic graph in the magnetic distribution map.

In embodiments of the present disclosure, the indoor area is divided into a plurality of sub-areas, and then the topologic graph is placed in a sub-map of the magnetic distribution map that corresponds to a sub-area in the plurality of sub-areas. In embodiments of the present disclosure, in order to select the plurality of APs, a building map is obtained for the indoor area, and then the plurality of APs are selected from indoor APs that are deployed within the indoor area based on the building map. In embodiments of the present disclosure, APs are selected from the indoor APs in response to a determination that the APs are in Line of Sight (LOS) based on the building map. In embodiments of the present disclosure, relative positions between a further AP in the indoor APs and the plurality of APs are obtained, and the further AP is different from the plurality of APs. Next, a further AP position of the further AP is determined based on the relative positions and the determined plurality of AP positions. In embodiments of the present disclosure, the number of the plurality of APs is above three.

With these embodiments, AP positions are mapped to the reference positions that have known absolute longitude and latitude values by comparing the magnetic measurements and the reference magnetic values in the magnetic distribution map. Therefore, the AP positions may be determined in an easy and effective way.

Figure 10:
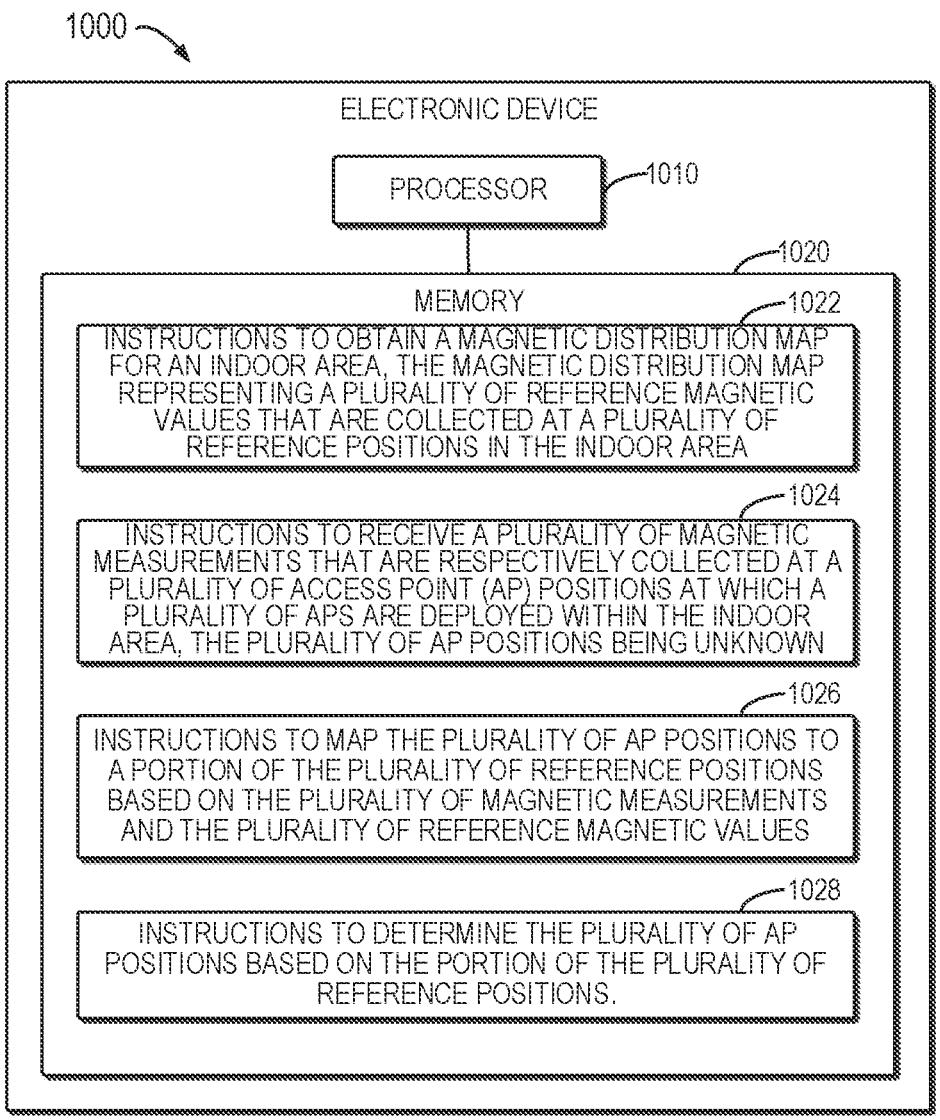
FIG. 10 illustrates a block diagram of an electronic device according to embodiments of the present disclosure.

FIG. 10 illustrates a block diagram of an electronic device 1000 according to embodiments of the present disclosure. The electronic device 1000 comprises a processor 1010 and a memory 1020 coupled to the processor 1010. The memory 1020 stores instructions 1022, 1024, 1026 and 1028 to cause the processor 1010 to implement the above method 900. In embodiments of the present disclosure, the instructions 1022 cause the processor 1010 to obtain a magnetic distribution map for an indoor area, the magnetic distribution map representing a plurality of reference magnetic values that are collected at a plurality of reference positions in the indoor area. The instructions 1024 cause the processor 1010 to receive a plurality of magnetic measurements that are respectively collected at a plurality of access point (AP) positions at which a plurality of APs are deployed within the indoor area, the plurality of AP positions being unknown. The instructions 1026 cause the processor 1010 to map the plurality of AP positions to a portion of the plurality of reference positions based on the plurality of magnetic measurements and the plurality of reference magnetic values. The instructions 1028 cause the processor 1010 to determine the plurality of AP positions based on the portion of the plurality of reference positions.

In some embodiments of the present disclosure, the memory 1020 further stores instructions to cause the processor 1010 to: generate a topologic graph for the plurality of APs based on relative distances among the plurality of AP positions, and match the plurality of AP positions to the portion of plurality of reference positions based on the topologic graph, the magnetic distribution map and the plurality of magnetic measurements. In some embodiments of the present disclosure, the memory 1020 further stores instructions to cause the processor 1010 to: place the topologic graph in the magnetic distribution map; build a cost function associated with a difference between magnetic measurements related to vertexes of the topologic graph and a group of reference magnetic values in the plurality of magnetic values that are related to the vertexes; and determine the portion of the plurality of reference positions in response to the cost function meeting a threshold criterion.

In some embodiments of the present disclosure, the memory 1020 further stores instructions to cause the processor 1010 to: select an initial position and an initial rotation for the topologic graph based on a comparison between the plurality of magnetic measurements and the plurality of reference magnetic values; and place the topologic graph in the magnetic distribution map based on the initial position and the initial rotation. In some embodiments of the present disclosure, the memory 1020 further stores instructions to cause the processor 1010 to move the topologic graph in the magnetic distribution map by any of: shifting the topologic graph in the magnetic distribution map; or rotating the topologic graph in the magnetic distribution map.

In some embodiments of the present disclosure, the memory 1020 further stores instructions to cause the processor 1010 to: divide the indoor area into a plurality of sub-areas; and place the topologic graph in a sub-map of the magnetic distribution map that corresponds to a sub-area in the plurality of sub-areas. In some embodiments of the present disclosure, the memory 1020 further stores instructions to cause the processor 1010 to: obtain a building map for the indoor area; and select the plurality of APs from indoor APs that are deployed within the indoor area based on the building map. In some embodiments of the present disclosure, the memory 1020 further stores instructions to cause the processor 1010 to select APs from the indoor APs in response to a determination that the APs are in Line of Sight (LOS) based on the building map. In some embodiments of the present disclosure, the memory 1020 further stores instructions to cause the processor 1010 to: obtain relative positions between a further AP in the indoor APs and the plurality of APs, the further AP being different from the plurality of APs; and determine a further AP position of the further AP based on the relative positions and the determined plurality of AP positions. In some embodiments of the present disclosure, the number of the plurality of APs is above three.

Program codes or instructions for carrying out methods of the present disclosure may be written in any combination of one or more programming languages. These program codes or instructions may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code or instructions may execute entirely on a machine, partly on the machine, as a stand-alone software package, partly on the machine and partly on a remote machine or entirely on the remote machine or server.

In the context of this disclosure, a machine-readable medium may be any tangible medium that may contain, or store a program for use by or in connection with an instruction execution system, apparatus, or device. The machine-readable medium may be a machine-readable signal medium or a machine-readable storage medium. A machine-readable medium may include but not limited to an electronic, magnetic, optical, electromagnetic, infrared, or semiconductor system, apparatus, or device, or any suitable combination of the foregoing. More specific examples of the machine-readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Certain features that are described in the context of separate embodiments may also be implemented in combination in a single embodiment. Conversely, various features that are described in the context of a single embodiment may also be implemented in multiple embodiments separately or in any suitable sub-combination.

In the foregoing Detailed Description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

What is claimed:

1. A method, comprising:
obtaining a magnetic distribution map for an indoor area, the magnetic distribution map representing a plurality of reference magnetic values that are collected at a plurality of reference positions in the indoor area;
receiving a plurality of magnetic measurements that are respectively collected at a plurality of access point (AP) positions at which a plurality of APs are deployed within the indoor area, the plurality of AP positions being unknown;
mapping the plurality of AP positions to a portion of the plurality of reference positions based on the plurality of magnetic measurements and the plurality of reference magnetic values by:
generating a topologic graph for the plurality of APs based on relative distances among the plurality of AP positions; and
matching the plurality of AP positions to the portion of plurality of reference positions based on the topologic graph, the magnetic distribution map and the plurality of magnetic measurements, wherein matching comprises:
placing the topologic graph in the magnetic distribution map;
building a cost function associated with a difference between magnetic measurements related to vertexes of the topologic graph and a group of reference magnetic values in the plurality of magnetic values that are related to the vertexes; and
determining the portion of the plurality of reference positions in response to the cost function meeting a threshold criterion; and
determining the plurality of AP positions based on the portion of the plurality of reference positions.

2. The method according to claim 1, wherein placing the topologic graph in the magnetic distribution map comprises:

selecting an initial position and an initial rotation for the topologic graph based on a comparison between the plurality of magnetic measurements and the plurality of reference magnetic values; and
placing the topologic graph in the magnetic distribution map based on the initial position and the initial rotation.

3. The method according to claim 2, wherein placing the topologic graph in the magnetic distribution map further comprises moving the topologic graph in the magnetic distribution map by any of:
shifting the topologic graph in the magnetic distribution map; or
rotating the topologic graph in the magnetic distribution map.

4. The method according to claim 2, wherein placing the topologic graph in the magnetic distribution map comprises:
dividing the indoor area into a plurality of sub-areas; and
placing the topologic graph in a sub-map of the magnetic distribution map that corresponds to a sub-area in the plurality of sub-areas.

5. The method according to claim 1, further comprises selecting the plurality of APs by:
obtaining a building map for the indoor area; and
selecting the plurality of APs from indoor APs that are deployed within the indoor area based on the building map.

6. The method according to claim 5, wherein selecting the plurality of APs comprises:
selecting APs from the indoor APs in response to a determination that the APs are in Line of Sight (LOS) based on the building map.

7. The method according to claim 5, further comprises:
obtaining relative positions between a further AP in the indoor APs and the plurality of APs, the further AP being different from the plurality of APs; and
determining a further AP position of the further AP based on the relative positions and the determined plurality of AP positions.

8. The method according to claim 1, wherein the number of the plurality of APs is above three.

9. An electronic device, comprising:
a processor and a memory coupled to the processor, the memory storing program instructions to cause the processor to implement a method, the method comprising:
obtaining a magnetic distribution map for an indoor area, the magnetic distribution map representing a plurality of reference magnetic values that are collected at a plurality of reference positions in the indoor area;
receiving a plurality of magnetic measurements that are respectively collected at a plurality of access point (AP) positions at which a plurality of APs are deployed within the indoor area, the plurality of AP positions being unknown;
mapping the plurality of AP positions to a portion of the plurality of reference positions based on the plurality of magnetic measurements and the plurality of reference magnetic values by:
generating a topologic graph for the plurality of APs based on relative distances among the plurality of AP positions; and
matching the plurality of AP positions to the portion of plurality of reference positions based on the topologic graph, the magnetic distribution map and the plurality of magnetic measurements, wherein matching comprises:
placing the topologic graph in the magnetic distribution map;
building a cost function associated with a difference between magnetic measurements related to vertexes of the topologic graph and a group of reference magnetic values in the plurality of magnetic values that are related to the vertexes; and
determining the portion of the plurality of reference positions in response to the cost function meeting a threshold criterion; and
determining the plurality of AP positions based on the portion of the plurality of reference positions.

10. The device according to claim 9, wherein placing the topologic graph in the magnetic distribution map comprises:
selecting an initial position and an initial rotation for the topologic graph based on a comparison between the plurality of magnetic measurements and the plurality of reference magnetic values; and
placing the topologic graph in the magnetic distribution map based on the initial position and the initial rotation.

11. The device according to claim 10, wherein placing the topologic graph in the magnetic distribution map further comprises moving the topologic graph in the magnetic distribution map by any of:
shifting the topologic graph in the magnetic distribution map; or
rotating the topologic graph in the magnetic distribution map.

12. The device according to claim 10, wherein placing the topologic graph in the magnetic distribution map comprises:
dividing the indoor area into a plurality of sub-areas; and
placing the topologic graph in a sub-map of the magnetic distribution map that corresponds to a sub-area in the plurality of sub-areas.

13. The device according to claim 9, wherein the number of the plurality of APs is above three, and the method further comprises selecting the plurality of APs by:
obtaining a building map for the indoor area; and
selecting the plurality of APs from indoor APs that are deployed within the indoor area based on the building map.

14. The device according to claim 13, wherein selecting the plurality of APs comprises:
selecting APs from the indoor APs in response to a determination that the APs are in Line of Sight (LOS) based on the building map.

15. The device according to claim 13, wherein the method further comprises:
obtaining relative positions between a further AP in the indoor APs and the plurality of APs, the further AP being different from the plurality of APs; and
determining a further AP position of the further AP based on the relative positions and the determined plurality of AP positions.

16. A a non-transitory computer readable storage medium having program instructions embodied therewith, the program instructions executable by a processor to cause the processor to perform a method comprising:
obtaining a magnetic distribution map for an indoor area, the magnetic distribution map representing a plurality of reference magnetic values that are collected at a plurality of reference positions in the indoor area;
receiving a plurality of magnetic measurements that are respectively collected at a plurality of access point (AP) positions at which a plurality of APs are deployed within the indoor area, the plurality of AP positions being unknown;

mapping the plurality of AP positions to a portion of the plurality of reference positions based on the plurality of magnetic measurements and the plurality of reference magnetic values by:
  generating a topologic graph for the plurality of APs based on relative distances among the plurality of AP positions; and
  matching the plurality of AP positions to the portion of plurality of reference positions based on the topologic graph, the magnetic distribution map and the plurality of magnetic measurements, wherein matching comprises:
  placing the topologic graph in the magnetic distribution map;
  building a cost function associated with a difference between magnetic measurements related to vertexes of the topologic graph and a group of reference magnetic values in the plurality of magnetic values that are related to the vertexes; and
  determining the portion of the plurality of reference positions in response to the cost function meeting a threshold criterion; and
determining the plurality of AP positions based on the portion of the plurality of reference positions.

* * * * *